(12) United States Patent
Kirmayer

(10) Patent No.: US 7,772,514 B2
(45) Date of Patent: Aug. 10, 2010

(54) CAPACITIVE USER-INTERFACE SWITCHES

(75) Inventor: Ehud Kirmayer, Moshav Orot (IL)

(73) Assignee: Verifone, Inc., San Jose, CA (US)

( * ) Notice: Subject to any disclaimer, the term of this patent is extended or adjusted under 35 U.S.C. 154(b) by 410 days.

(21) Appl. No.: 11/961,503

(22) Filed: Dec. 20, 2007

(65) Prior Publication Data
US 2009/0161325 A1    Jun. 25, 2009

(51) Int. Cl.
*H01H 9/00* (2006.01)
(52) U.S. Cl. .................. 200/600; 200/512; 200/296
(58) Field of Classification Search .............. 200/5 R, 200/600, 512, 296, 511; 341/20–22, 33, 341/34; 345/156, 157, 168, 169, 173
See application file for complete search history.

(56) References Cited

U.S. PATENT DOCUMENTS

| | | | |
|---|---|---|---|
| 4,593,384 A | 6/1986 | Kleijne et al. | |
| 4,807,284 A | 2/1989 | Kleijne et al. | |
| 5,293,017 A * | 3/1994 | Bartlett | 200/511 |
| 5,353,350 A | 10/1994 | Unsworth et al. | |
| 5,493,082 A * | 2/1996 | Bloch et al. | 200/16 A |
| 5,861,662 A | 1/1999 | Candelore | |
| 5,877,547 A | 3/1999 | Rhelimi et al. | |
| 5,998,858 A | 12/1999 | Little et al. | |
| 6,148,183 A * | 11/2000 | Higdon et al. | 455/575.1 |
| 6,265,682 B1 * | 7/2001 | Lee | 200/600 |
| 6,359,338 B1 | 3/2002 | Takabayashi et al. | |
| 6,414,884 B1 | 7/2002 | DeFelice et al. | |
| 6,438,825 B1 | 8/2002 | Kuhn | |
| 6,573,854 B1 * | 6/2003 | Hug et al. | 341/176 |
| 6,664,489 B2 * | 12/2003 | Kleinhans et al. | 200/313 |
| 7,217,900 B2 * | 5/2007 | Gama et al. | 200/600 |
| 7,232,973 B2 * | 6/2007 | Kaps et al. | 200/600 |
| 7,586,735 B2 * | 9/2009 | Chen et al. | 361/288 |

FOREIGN PATENT DOCUMENTS

| | | |
|---|---|---|
| EP | 0375545 | 6/1990 |
| EP | 1432031 | 6/2004 |

OTHER PUBLICATIONS

Van Ess, Dave. "Capacitive Touch Switches for Automotive Applications." http://www.automotivedesignline.com/, Feb. 2006.
Kremin, Victor et al. "Capacitive Sensing—Waterproof Capacitance Sensing." Cypress Perform, Dec. 2006.

* cited by examiner

*Primary Examiner*—Michael A Friedhofer
(74) *Attorney, Agent, or Firm*—Fish & Richardson P.C.

(57) ABSTRACT

An electronic device including a housing having an outer surface, at least one printed circuit board located within the housing and having at least one edge located in propinquity to at least one corresponding edge region of the outer surface, at least one capacitance sensor located at the at least one edge of the printed circuit board and being adapted to sense a change in capacitance at the at least one corresponding edge region resulting from engagement therewith by an object having predetermined capacitance characteristics and capacitance change responsive switching circuitry located within the housing and coupled to the at least one capacitance sensor for providing a desired switching function responsive to the engagement.

11 Claims, 4 Drawing Sheets

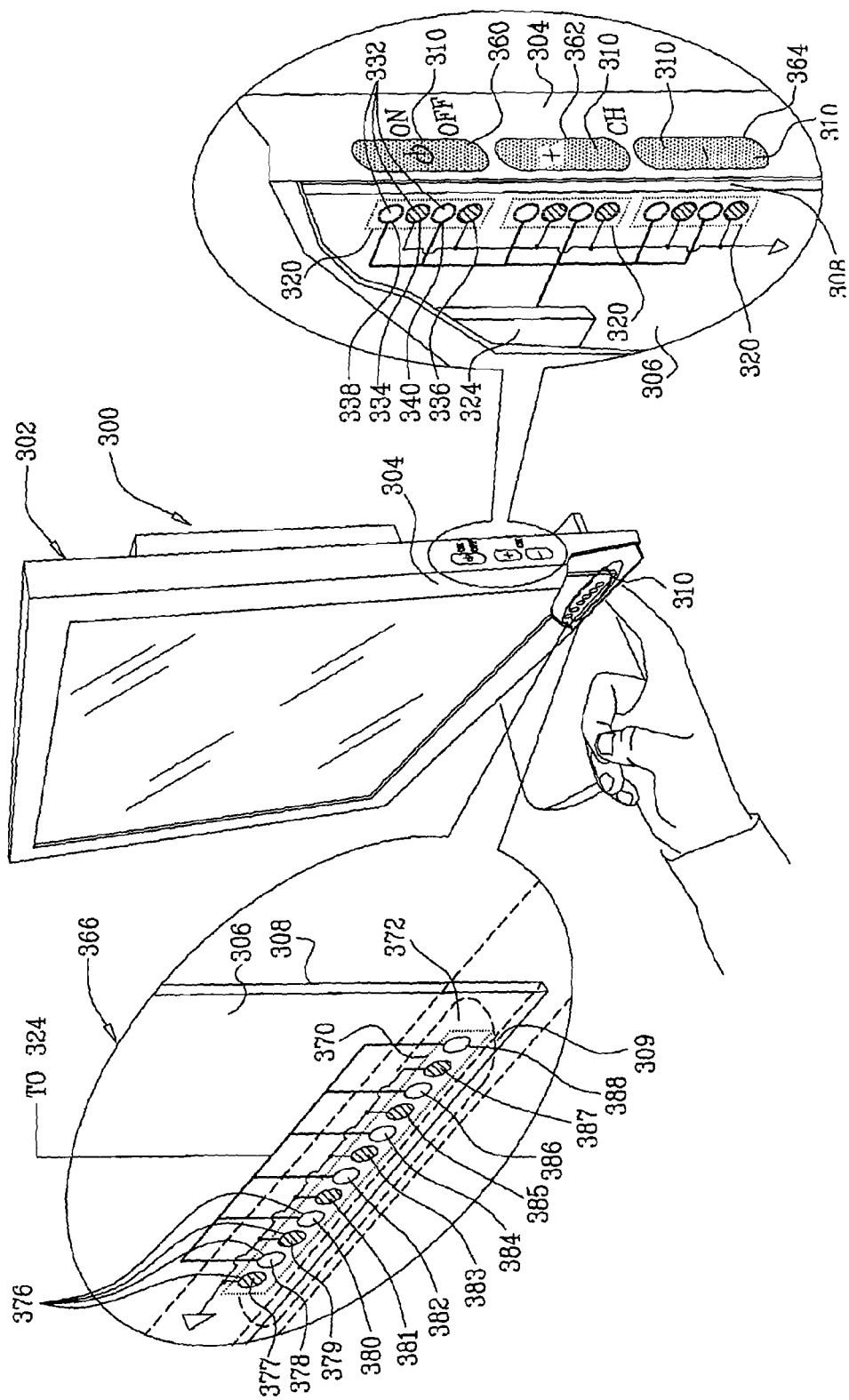

CAPACITIVE USER-INTERFACE SWITCHES

FIELD OF THE INVENTION

The present invention relates to user-interface switches generally and more particularly to capacitive user-interface switches.

BACKGROUND OF THE INVENTION

The following prior art publication is believed to represent the current state of the art and the content thereof is hereby incorporated by reference:

Capacitive Touch Switches for Automotive Applications by Dave Van Ess, published in Automotive Design Line (http://www.automotivedesignline.com) February, 2006.

SUMMARY OF THE INVENTION

The present invention seeks to provide a device including enhanced capacitance change responsive functionality.

There is thus provided in accordance with a preferred embodiment of the present invention an electronic device including a housing having an outer surface, at least one printed circuit board located within the housing and having at least one edge located in propinquity to at least one corresponding edge region of the outer surface, at least one capacitance sensor located at the at least one edge of the printed circuit board and being adapted to sense a change in capacitance at the at least one corresponding edge region resulting from engagement therewith by an object having predetermined capacitance characteristics and capacitance change responsive switching circuitry located within the housing and coupled to the at least one capacitance sensor for providing a desired switching function responsive to the engagement.

Preferably, the at least one capacitance sensor includes at least one plated-through hole extending through the printed circuit board adjacent the at least one edge. Alternatively, the at least one capacitance sensor includes a plurality of adjacent plated-through holes extending through the printed circuit board adjacent the at least one edge, adjacent ones of the plated-through holes being maintained at different voltages.

Preferably, the at least one capacitance sensor is adapted to sense a change in capacitance at the at least one corresponding edge region resulting from engagement therewith by a human appendage. Additionally or alternatively, the at least one capacitance sensor includes environmental compensation functionality for compensating for changes in at least one of temperature and humidity.

Preferably, the at least one capacitance sensor includes at least one plated-through via extending through the printed circuit board adjacent the at least one edge. Alternatively, the at least one capacitance sensor includes a plurality of adjacent plated-through vias extending through the printed circuit board adjacent the at least one edge, adjacent ones of the plated-through vias being maintained at different voltages.

Preferably, the at least one capacitance sensor and the capacitance change responsive switching circuitry provide slider switch functionality. Additionally, the capacitance change responsive switching circuitry is responsive to at least one of location and speed of displacement of the object along the edge region.

Preferably, the capacitance change responsive switching circuitry is embodied in an integrated circuit. Preferably, the capacitance change responsive switching circuitry includes an integrator and a comparator.

BRIEF DESCRIPTION OF THE DRAWINGS

The present invention will be understood and appreciated more fully from the following detailed description, taken in conjunction with the drawings in which:

FIG. 3 is a simplified partially cut-away pictorial illustration of a display constructed and operative in accordance with a preferred embodiment of the present invention.

DETAILED DESCRIPTION OF PREFERRED EMBODIMENTS

Figure 1A:
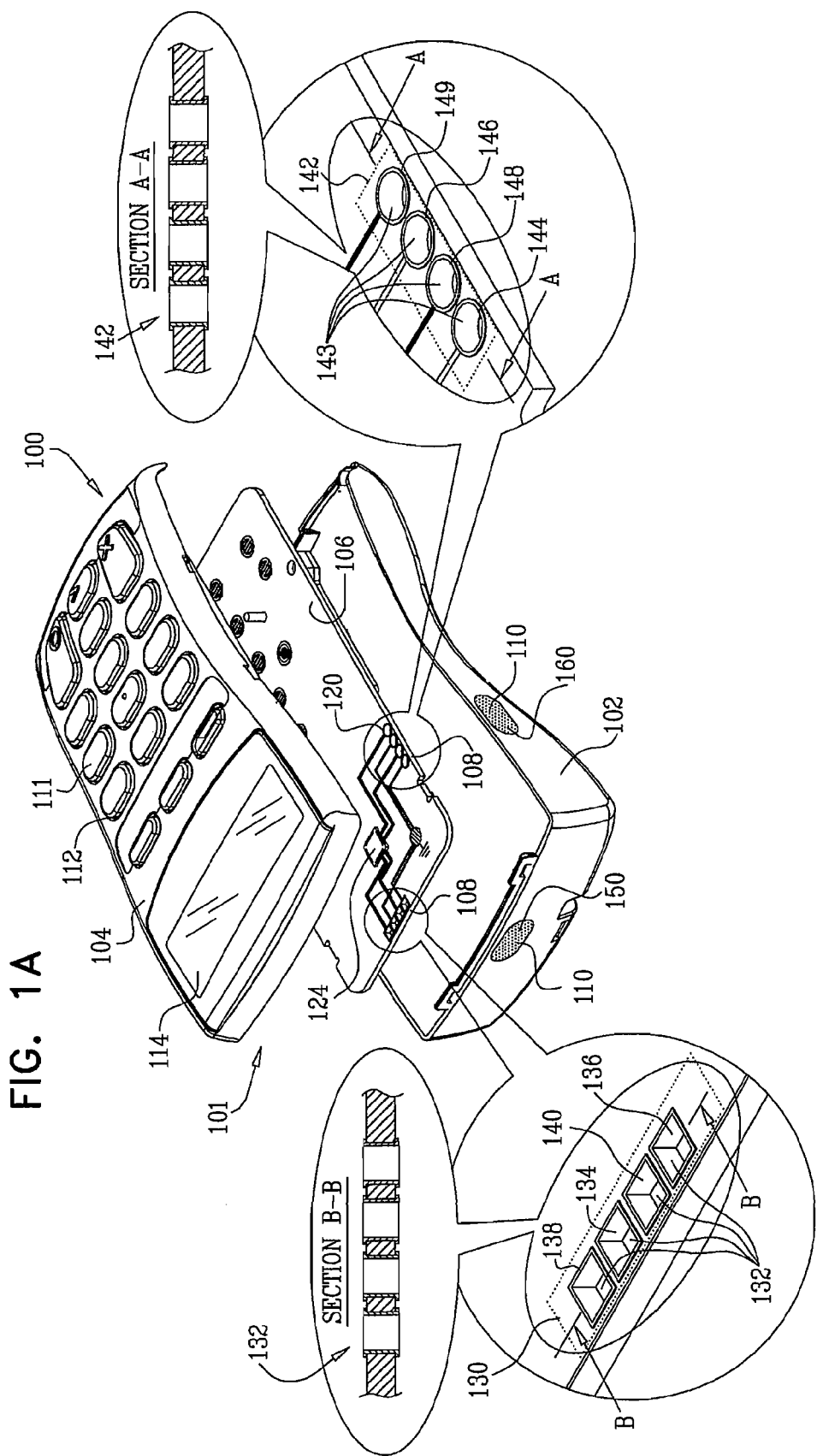
FIG. 1A is a simplified pictorial, exploded view illustration of a point of sale device constructed and operative in accordance with a preferred embodiment of the present invention.
Figure 1B:
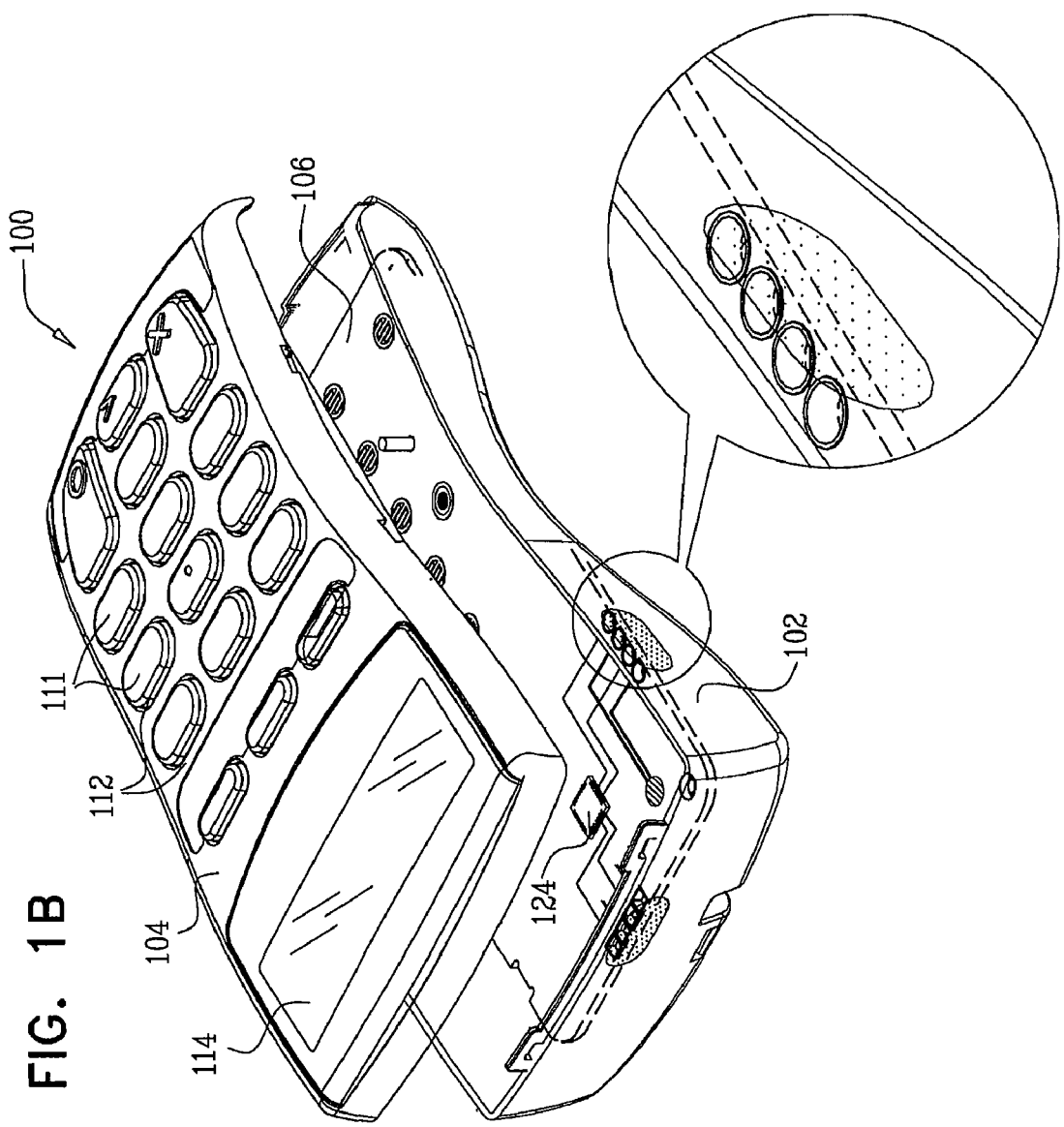
FIG. 1B is a simplified partially pictorial, partially assembled view illustration of the point of sale device of FIG. 1A.

Reference is now made to FIGS. 1A and 1B, which illustrate a point of sale device constructed and operative in accordance with a preferred embodiment of the present invention. It is appreciated that the present invention is applicable to a wide range of electronic devices as diverse as point of sale devices, telephones and televisions but is not limited in its application to such devices.

As seen in FIGS. 1A and 1B, a portable point of sale device, here a PIN pad 100, includes a housing 101 formed of a bottom housing portion 102 and a top housing portion 104. A printed circuit board 106 is located within the housing 101 and has at least one edge 108 located in propinquity to at least one corresponding edge region 110 of an outer surface of the housing 101.

A keypad assembly includes keys 111 which extend through corresponding apertures 112 in top housing portion 104. A display 114 is mounted on top housing portion 104.

In accordance with a preferred embodiment of the present invention, at least one capacitance sensor 120 is located at at least one edge 108 of printed circuit board 106 and is adapted to sense a change in capacitance at at least one corresponding edge region 110 resulting from engagement therewith by an object having predetermined capacitance characteristics, such as a human appendage. Capacitance change responsive switching circuitry 124, located within housing 101 and coupled to at least one capacitance sensor 120, provides a desired switching function responsive to that engagement.

In the illustrated embodiment of FIGS. 1A and 1B, two different configurations of capacitance sensor 120 are incorporated into the printed circuit board 106. A first capacitance sensor 130 comprises a series 132 of plated through vias, here of generally square configuration and preferably of cross sectional dimensions 3 mm×3 mm. Vias 134 and 136 are preferably connected to ground, while vias 138 and 140 are connected to capacitance change responsive switching circuitry 124.

A second capacitance sensor 142 comprises a series 143 of plated through vias or other holes, here of generally circular configuration and preferably with a cross sectional diameter of 8.5 mm. Vias 144 and 146 are preferably connected to ground, while vias 148 and 149 are connected to capacitance change responsive switching circuitry 124.

It is a particular feature of the present invention that capacitance sensors 120 are extremely close to corresponding edge regions 110 of the outer surface of the housing 101. In the illustrated embodiment, the outermost edges of vias 134, 136, 138 and 140 are preferably separated from a corresponding edge region 150 by no more than approximately 1.5 mm. In such a case, if the wall thickness of housing 101 at this location is approximately 1 mm, the corresponding edge 108 of the printed circuit board 106 preferably touches an inner surface of the housing 101 opposite region 150 and the outermost edges of vias 134, 136, 138 and 140 are preferably separated from edge 108 by no more than 0.5 mm.

In the illustrated embodiment, the outermost points of vias 144, 146, 148 and 149 are preferably separated from a corresponding edge region 160 by no more than approximately 1.5 mm. In such a case, if the wall thickness of housing 101 at this location is approximately 1 mm, the corresponding edge 108 of the printed circuit board 106 preferably touches an inner surface of the housing 101 opposite region 160 and the outermost points of vias 144, 146, 148 and 149 are preferably separated from edge 108 by no more than 0.5 mm.

Capacitance change responsive switching circuitry 124 is preferably embodied in an integrated circuit, such as an AD7142 of Analog Devices or a CapSense of Cypress Semiconductor, and may include temperature, humidity and environmental drift compensation functionality. Capacitance change responsive switching circuitry 124 preferably provides reference and current capacitance metric outputs to a processor (not shown) forming part thereof, which typically stores the outputs in a RAM and makes a determination of whether changes in sensed capacitance exceed predetermined thresholds and actuate switching.

It is appreciated that the capacitance change responsive switching circuitry 124 can be embodied in an integrated circuit or alternatively in a hard wired circuit employing discrete components. Changes in capacitance value can be detected without employing a conventional memory chip, but instead by using electronic circuitry having an integrator and a comparator. In such a case the output voltage of the capacitance sensor is inputted to the integrator and to a first input of the comparator. The output of the integrator is inputted to a second input of the comparator. Switching is actuated when the output of the comparator changes by at least a predetermined amount.

The threshold level of a change in capacitance which provides a switching input can be dependent on timing, magnitude and other characteristics of the capacitance change. For example, if the engagement is of a time duration less than a predetermined time duration, switching may not be actuated.

Figure 2:
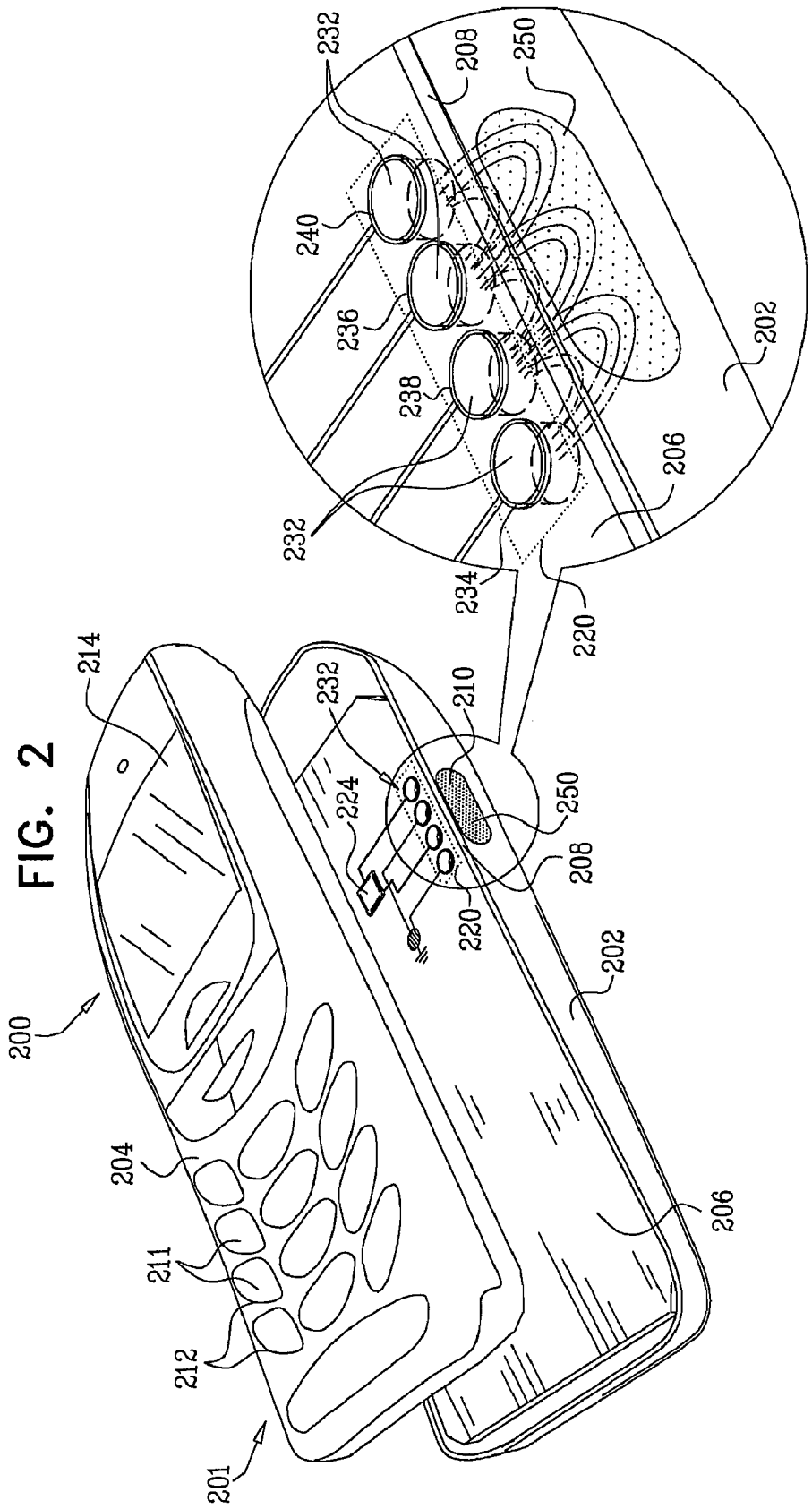
FIG. 2 is a simplified pictorial partially assembled illustration of a mobile telephone constructed and operative in accordance with a preferred embodiment of the present invention.

Reference is now made to FIG. 2, which is a simplified pictorial partially assembled illustration of a mobile telephone constructed and operative in accordance with a preferred embodiment of the present invention.

As seen in FIG. 2, a mobile telephone 200 includes a housing 201 formed of a bottom housing portion 202 and a top housing portion 204. A printed circuit board 206 is located within the housing 201 and has at least one edge 208 located in propinquity to at least one corresponding edge region 210 of an outer surface of the housing 201.

A keypad assembly includes keys 211 which extend through corresponding apertures 212 in top housing portion 204. A display 214 is mounted on top housing portion 204.

In accordance with a preferred embodiment of the present invention, at least one capacitance sensor 220 is located at an edge 208 of printed circuit board 206 and is adapted to sense a change in capacitance at a corresponding edge region 210 resulting from engagement therewith by an object having predetermined capacitance characteristics, such as a human appendage. Capacitance change responsive switching circuitry 224, located within housing 201 and coupled to at least one capacitance sensor 220, provides a desired switching function responsive to that engagement.

In the illustrated embodiment of FIG. 2, capacitance sensor 220 comprises a series 232 of plated through vias, here of generally circular configuration and preferably with a cross sectional diameter of 8.5 mm. Vias 234 and 236 are preferably connected to ground, while vias 238 and 240 are connected to capacitance change responsive switching circuitry 224.

It is a particular feature of the present invention that capacitance sensor 220 is extremely close to corresponding edge region 210 of the outer surface of the housing 201. In the illustrated embodiment, the outermost points of vias 234, 236, 238 and 240 are preferably separated from a corresponding edge region 250 by no more than approximately 1.5 mm. In such a case, if the wall thickness of housing 201 at this location is approximately 1 mm, the corresponding edge 208 of the printed circuit board 206 preferably touches an inner surface of the housing 201 opposite region 250 and the outermost points of vias 234, 236, 238 and 240 are preferably separated from edge 208 by no more than 0.5 mm.

Capacitance change responsive switching circuitry 224 is preferably embodied in an integrated circuit, such as an AD7142 of Analog Devices or a CapSense of Cypress Semiconductor and may include temperature, humidity and environmental drift compensation functionality. Capacitance change responsive switching circuitry 224 preferably provides reference and current capacitance metric outputs to a processor (not shown) forming part thereof, which typically stores the outputs in a RAM and makes a determination of whether changes in sensed capacitance exceed predetermined thresholds and actuate switching.

It is appreciated that the capacitance change responsive switching circuitry 224 can be embodied in an integrated circuit or alternatively in a hard wired circuit employing discrete components. Changes in capacitance value can be detected without employing a conventional memory chip, but instead by using electronic circuitry having an integrator and a comparator. In such a case the output voltage of the capacitance sensor is inputted to the integrator and to a first input of the comparator. The output of the integrator is inputted to a second input of the comparator. Switching is actuated when the output of the comparator exceeds a predetermined value.

The threshold level of a change in capacitance which provides a switching input can be dependent on timing, magnitude and other characteristics of the capacitance change. For example, if the engagement is of a time duration less than a predetermined time duration, switching may not be actuated.

Reference is now made to FIG. 3, which is a simplified partially cut-away pictorial illustration of a display, here a television, constructed and operative in accordance with a preferred embodiment of the present invention.

As seen in FIG. 3, a television 300 includes a housing 302 comprising a peripheral frame portion 304. A printed circuit board 306 is located within the housing 302 and has at least one edge and preferably at least two edges 308 and 309 located in propinquity to at least one corresponding edge region 310 of an outer surface of the peripheral frame portion 304.

In accordance with a preferred embodiment of the present invention, at least one capacitance sensor 320 is located at edge 308 of printed circuit board 306 and is adapted to sense a change in capacitance at at least one corresponding edge region 310 resulting from engagement therewith by an object having predetermined capacitance characteristics, such as a human appendage. Capacitance change responsive switching circuitry 324, located within housing 302 and coupled to at least one capacitance sensor 320, provides a desired switching function responsive to that engagement.

In the illustrated embodiment of FIG. 3, capacitance sensor 320 comprises a series 332 of plated through vias or other holes, here of generally circular configuration and preferably with a cross sectional diameter of 8.5 mm. Vias 334 and 336 are preferably connected to ground, while vias 338 and 340 are connected to capacitance change responsive switching circuitry 324.

It is a particular feature of the present invention that capacitance sensor 320 is extremely close to corresponding edge region 310 of the outer surface of the peripheral frame portion 304. In the illustrated embodiment, the outermost points of vias 334, 336, 338 and 340 are preferably separated from a corresponding edge region 310 by no more than approximately 1.5 mm. In such a case, if the wall thickness of peripheral frame portion 304 at this location is approximately 1 mm, the corresponding edge 308 of the printed circuit board 306 preferably touches an inner surface of the peripheral frame portion 304 opposite region 310 and the outermost points of vias 334, 336, 338 and 340 are preferably separated from edge 308 by no more than 0.5 mm.

Capacitance change responsive switching circuitry 324 is preferably embodied in an integrated circuit, such as an AD7142 of Analog Devices or a CapSense of Cypress Semiconductor and may include temperature, humidity and environmental drift compensation functionality. Capacitance change responsive switching circuitry 324 preferably provides reference and current capacitance metric outputs to a processor (not shown) forming part thereof, which typically stores the outputs in a RAM and makes a determination of whether changes in sensed capacitance exceed predetermined thresholds and actuate switching.

It is appreciated that the capacitance change responsive switching circuitry 324 can be embodied in an integrated circuit or alternatively in a hard wired circuit employing discrete components. Changes in capacitance value can be detected without employing a conventional memory chip, but instead by using electronic circuitry having an integrator and a comparator. In such a case the output voltage of the capacitance sensor is inputted to the integrator and to a first input of the comparator. The output of the integrator is inputted to a second input of the comparator. Switching is actuated when the output of the comparator exceeds a predetermined value.

The threshold level of a change in capacitance which provides a switching input can be dependent on timing, magnitude and other characteristics of the capacitance change. For example, if the engagement is of a time duration less than a predetermined time duration, switching may not be actuated.

The capacitance sensor 320 and capacitance change responsive switching circuitry 324 may be employed for any suitable purpose, such as an ON-OFF switch 360 for the television. Additional capacitive change responsive switches 362 and 364, which may have the same or similar structure and function as switch 360, may be provided, as illustrated, to have a combined channel select functionality.

Alternatively or additionally, a slider-type capacitive change responsive switch 366 may provide volume select functionality. As seen in FIG. 3, switch 366 preferably comprises at least one capacitance sensor 370 located at edge 309 of printed circuit board 306 and is adapted to sense changes in capacitance at various locations along a corresponding edge region 372 resulting from engagement therewith by an object having predetermined capacitance characteristics, such as a human appendage. Capacitance change responsive switching circuitry 324, located within housing 302 and coupled to at least one capacitance sensor 370, provides a desired sliding switching function responsive to that engagement.

In the illustrated embodiment of FIG. 3, capacitance sensor 370 comprises a series 376 of a large number of plated through vias or other holes, here of generally circular configuration and preferably with a cross sectional diameter of 8.5 mm. Vias 377, 379, 381, 383, 385 and 387 are preferably connected to ground, while vias 378, 380, 382, 384, 386 and 388 are connected to capacitance change responsive switching circuitry 324.

It is a particular feature of the present invention that capacitance sensor 370 is extremely close to corresponding edge region 372 of the outer surface of the peripheral frame portion 304. In the illustrated embodiment, the outermost points of vias 377-388 are preferably separated from corresponding edge region 370 by no more than approximately 1.5 mm. In such a case, if the wall thickness of peripheral frame portion 304 at this location is approximately 1 mm, the corresponding edge 309 of the printed circuit board 306 preferably touches an inner surface of the peripheral frame portion 304 opposite region 370 and the outermost points of vias 377-388 are preferably separated from edge 309 by no more than 0.5 mm.

Capacitance change responsive switching circuitry 324 preferably provides conventional slider switch functionality and may be responsive to one or both of location and speed of displacement of an appendage along edge region 370.

It will be appreciated by persons skilled in the art that the present invention is not limited to what has been particularly shown and described hereinabove. Rather the scope of the present invention includes both combinations and subcombinations of various feature described hereinabove as well as modifications and variations thereof which would occur to a person skilled in the art upon reading the foregoing description and which are not in the prior art.

The invention claimed is:

1. An electronic device comprising:
a housing having an outer surface;
at least one printed circuit board located within said housing and having at least one edge located in propinquity to at least one corresponding edge region of said outer surface;
at least one capacitance sensor located at said at least one edge of said printed circuit board and being adapted to sense a change in capacitance at said at least one corresponding edge region resulting from engagement therewith by an object having predetermined capacitance characteristics; and
capacitance change responsive switching circuitry located within said housing and coupled to said at least one capacitance sensor for providing a desired switching function responsive to said engagement.

2. An electronic device according to claim 1 and wherein said at least one capacitance sensor comprises at least one plated-through hole extending through said printed circuit board adjacent said at least one edge.

3. An electronic device according to claim 1 and wherein said at least one capacitance sensor comprises a plurality of adjacent plated-through holes extending through said printed circuit board adjacent said at least one edge, adjacent ones of said plated-through holes being maintained at different voltages.

4. An electronic device according to claim 1 and wherein said at least one capacitance sensor is adapted to sense a change in capacitance at said at least one corresponding edge region resulting from engagement therewith by a human appendage.

5. An electronic device according to claim 1 and wherein said at least one capacitance sensor includes environmental compensation functionality for compensating for changes in at least one of temperature and humidity.

6. An electronic device according to claim 1 and wherein said at least one capacitance sensor comprises at least one plated-through via extending through said printed circuit board adjacent said at least one edge.

7. An electronic device according to claim 1 and wherein said at least one capacitance sensor comprises a plurality of adjacent plated-through vias extending through said printed circuit board adjacent said at least one edge, adjacent ones of said plated-through vias being maintained at different voltages.

8. An electronic device according to claim 1 and wherein said at least one capacitance sensor and said capacitance change responsive switching circuitry provide slider switch functionality.

9. An electronic device according to claim 8 and wherein said capacitance change responsive switching circuitry is responsive to at least one of location and speed of displacement of said object along said edge region.

10. An electronic device according to claim 1 and wherein said capacitance change responsive switching circuitry is embodied in an integrated circuit.

11. An electronic device according to claim 1 and wherein said capacitance change responsive switching circuitry comprises an integrator and a comparator.

* * * * *